United States Patent
Watanabe

[11] Patent Number: 6,163,461
[45] Date of Patent: Dec. 19, 2000

[54] TERMINAL MOUNTING STRUCTURE FOR A PRINTED CIRCUIT BOARD

[75] Inventor: Yoshikiyo Watanabe, Fukushima-ken, Japan

[73] Assignee: Alps Electric Co., Ltd.

[21] Appl. No.: 09/281,158

[22] Filed: Mar. 30, 1999

[30] Foreign Application Priority Data

Apr. 3, 1998 [JP] Japan .................................. 10-091394

[51] Int. Cl.[7] ...................................................... H05K 7/02
[52] U.S. Cl. .......................... 361/760; 361/773; 361/774; 174/52.4; 439/876
[58] Field of Search ..................................... 361/760, 773, 361/774, 803; 174/82.4; 257/676, 692; 439/876, 69, 74

[56] References Cited

U.S. PATENT DOCUMENTS

| | | | |
|---|---|---|---|
| 4,991,666 | 2/1991 | Septfons et al. | 174/261 |
| 5,910,885 | 6/1999 | Gulachenski et al. | 361/774 |

OTHER PUBLICATIONS

Unexamined Utility Model Publication No. Sho 61–93978 "Connecting Terminal of printed Circuit Board," Jun. 17, 1986.

Unexamined Utility Model Publication No. Sho 61–106042 (Date Unknown).

*Primary Examiner*—Jeffrey Gaffin
*Assistant Examiner*—Tuan Dinh
*Attorney, Agent, or Firm*—Brinks Hofer Gilson & Lione

[57] ABSTRACT

A terminal mounting structure for a printed circuit board according to the present invention comprises a printed circuit board having a wiring pattern and a slit formed in an end face of the board and a terminal connected to the wiring pattern on the board, the terminal being provided with a holding portion having first and second clamp pieces and a connection piece for connection between both clamp pieces, the connection piece being inserted into the slit formed in the printed circuit board to position the terminal with respect to the printed circuit board, and the first and second clamp pieces being connected to the wiring pattern.

4 Claims, 2 Drawing Sheets

TERMINAL MOUNTING STRUCTURE FOR A PRINTED CIRCUIT BOARD

BACKGROUND OF THE INVENTION

1. Field of the Invention

The present invention relates to a structure for mounting a terminal to a printed circuit board, and the structure is suitable for use in a transmitter-receiver unit for example.

2. Description of the Related Art

FIG. 3 is a sectional view showing a conventional terminal mounting structure for a printed circuit board and FIG. 4 is a partial perspective view thereof.

As shown in FIGS. 3 and 4, the conventional terminal mounting structure for a printed circuit board comprises a printed circuit board 1 formed with a predetermined electronic circuit and terminals 5 connected to the electronic circuit of the printed circuit board 1.

The printed circuit board 1 comprises a board 2 which is formed in the shape of a flat plate using a glass-filled epoxy resin for example, wiring patterns 3 formed in predetermined shapes by, for example, etching a copper foil on both the surface and the back of the board 2, and a plurality of electric components 4 such as an integrated circuit (LSI), a chip capacitor and a chip resistor, connected to the wiring patterns 3. Also near each of associated end faces 2a of the board 2 there are formed wiring patterns 3 on both the surface and the back of the board. A predetermined electronic circuit is formed by the electric components 4 and the wiring patterns 3.

Each terminal 5 is formed by punching and bending an electrically conductive metallic plate and it comprises a lead-out terminal portion 5a and a generally U-shaped holding portion 5b projecting in a direction perpendicular to the lead-out terminal portion 5a. The lead-out terminal portion 5a has a narrow part 5c and a wide part 5d. The holding portion 5b comprises two first retaining parts 5e bent nearly at right angles from the wide portion 5d and a second retaining portion 5f bent in L shape. Tip ends of the first and second retaining parts 5e, 5f are substantially in parallel with each other.

The terminal 5 comes into engagement with an end face 2a of the board 2 of the printed circuit board 1 so as to clamp the board 2. In this engaged state, the first retaining parts 5e of the holding portion 1 are abutted against a wiring pattern 3 formed on the back of the board 2, while the second retaining part 5f is abutted against a wiring pattern 3 formed on the board surface. Further, wiring patterns 3 on the surface and the back are connected together electrically through the terminal 5. The terminal 5 thus abutted against the wiring patterns 3 are fixed to the wiring patterns 3 by soldering (not shown).

A plurality of such terminals 5 are disposed at predetermined positions of the board 2.

Each terminal 5 is mounted to the printed circuit board in the following manner.

First, the electric components 4 are temporarily fixed to predetermined positions of the wiring patterns 3 formed on the board 2 and are then fixed to the wiring patterns 3 by soldering. Next, from an end face 2a of the board 2 and at a position where the generally U-shaped holding portion 5b of each terminal 5 will come into contact with predetermined wiring patterns 3 located near the end face 2a on the board 2, the holding portion 5b of the terminal 5 is brought into engagement with the wiring patterns 3 so as to clamp the board. Then, the wiring patterns 3 and the first and second retaining parts 5e, 5f of the holding portion 5b are fixed together by soldering. Now, the terminal mounting operation is completed.

In mounting each terminal 5 to the printed circuit board according to the conventional terminal mounting structure, however, when the generally U-shaped holding portion 5b of each terminal 5 is to be clamped onto the board 2 from an end face 2a of the board, any member (or position) serving as a reference in the terminal mounting operation is found neither on the board 2 side nor on the terminal 5 side, but the same operation is performed visually, so it is difficult to effect positioning of the terminal 5 relative to the board 2, thus giving rise to the problem that the terminal mounting operation is troublesome and difficult.

The terminal 5 thus mounted to the board 2 is then fixed to wiring patterns 3 by soldering. Before the soldering, However, the terminal 5 is attached merely by clamping generally U-shaped holding portion 5b onto the board 2, so if in this state anything should strike against the terminal 5, the terminal 5 will be dislocated easily, making soldering difficult.

SUMMARY OF THE INVENTION

The present invention has been accomplished for solving the above-mentioned problems and it is an object of the invention to provide a terminal mounting structure which can mount a terminal to a printed circuit board easily and reliably.

The terminal mounting structure of the present invention comprises a printed circuit board having a wiring pattern formed on at least one side of the board and also having a slit formed in an end face of the board, and a terminal connected to the wiring pattern on the printed circuit board, the terminal having a U-shaped holding portion provided with first and second clamp pieces and a connection piece for connection between both clamp pieces, the connection piece being inserted into the slit to position the terminal with respect to the printed circuit board, the printed circuit board being clamped by the first and second clamp pieces, and the first or the second clamp piece being connected to the wiring pattern on the printed circuit board.

Preferably, at least one of the first and second clamp pieces of the terminal is provided with a resilient part for elastic contact with the printed circuit board.

Preferably, the connection piece of the terminal is formed with a protuberance for pressure contact with an inner wall of the slit formed in the printed circuit board.

Preferably, the length of the second clamp piece in an extending direction of the connection piece is larger than the length of the first clamp piece in the same direction, and a projecting part extending in a direction orthogonal to the extending direction of the connection piece is formed at one side of the second clamp piece.

DETAILED DESCRIPTION OF A PREFERRED EMBODIMENT

Figure 1:
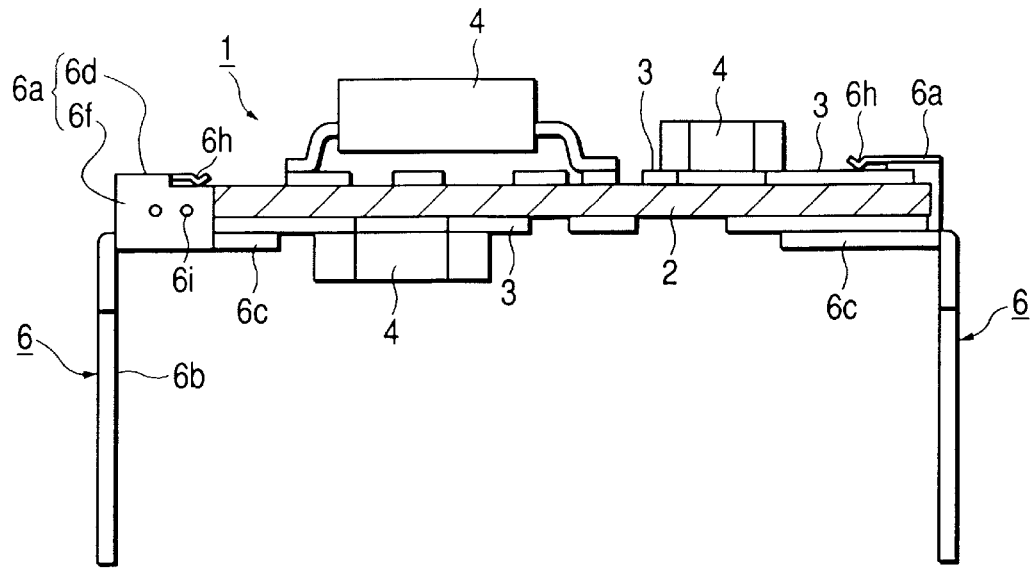
FIG. 1 is a sectional view showing a terminal mounting structure f or a printed circuit board according to an embodiment of the present invention.
Figure 2:
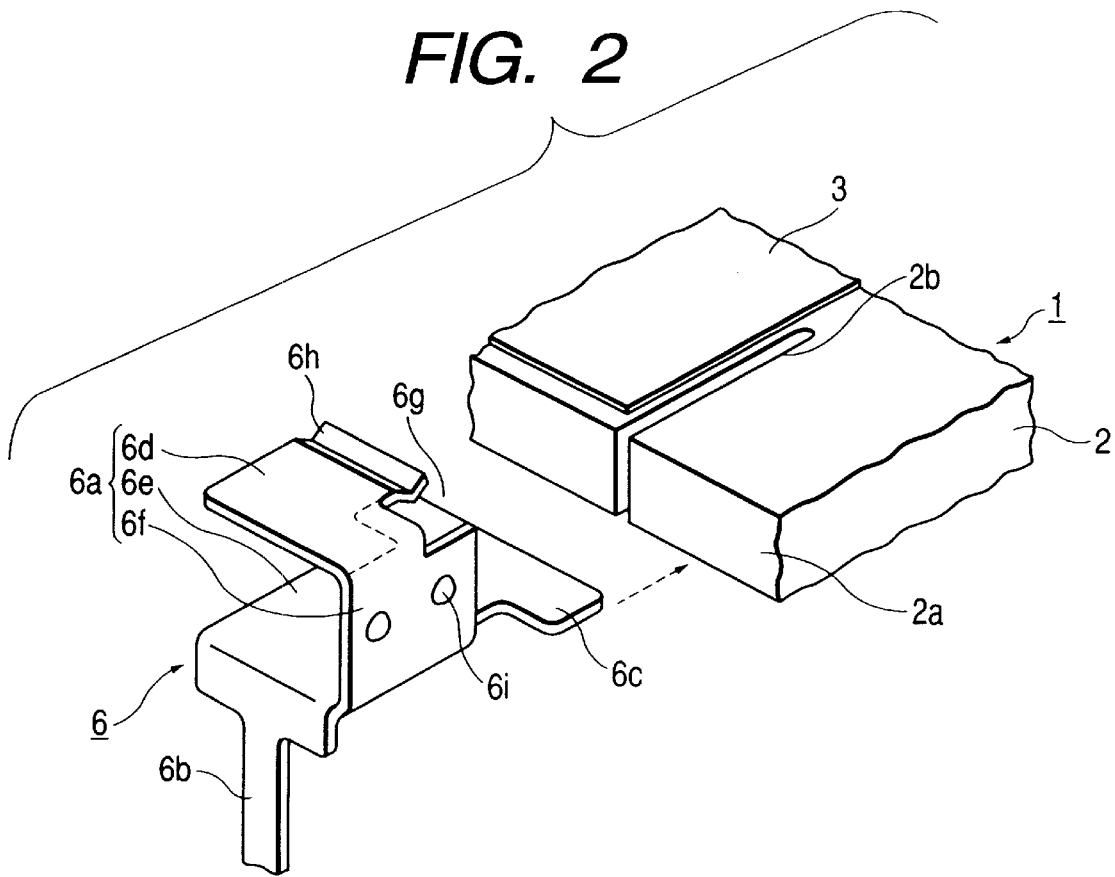
FIG. 2 is a partial perspective view thereof.
Figure 3:
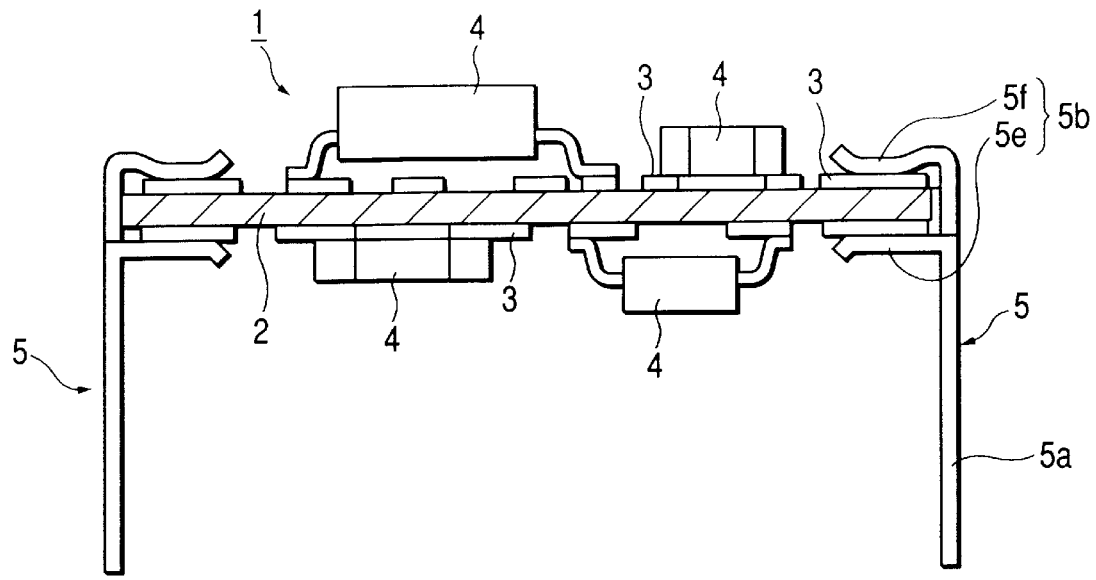
FIG. 3 is a sectional view showing a conventional terminal mounting structure for a printed circuit board.
Figure 4:
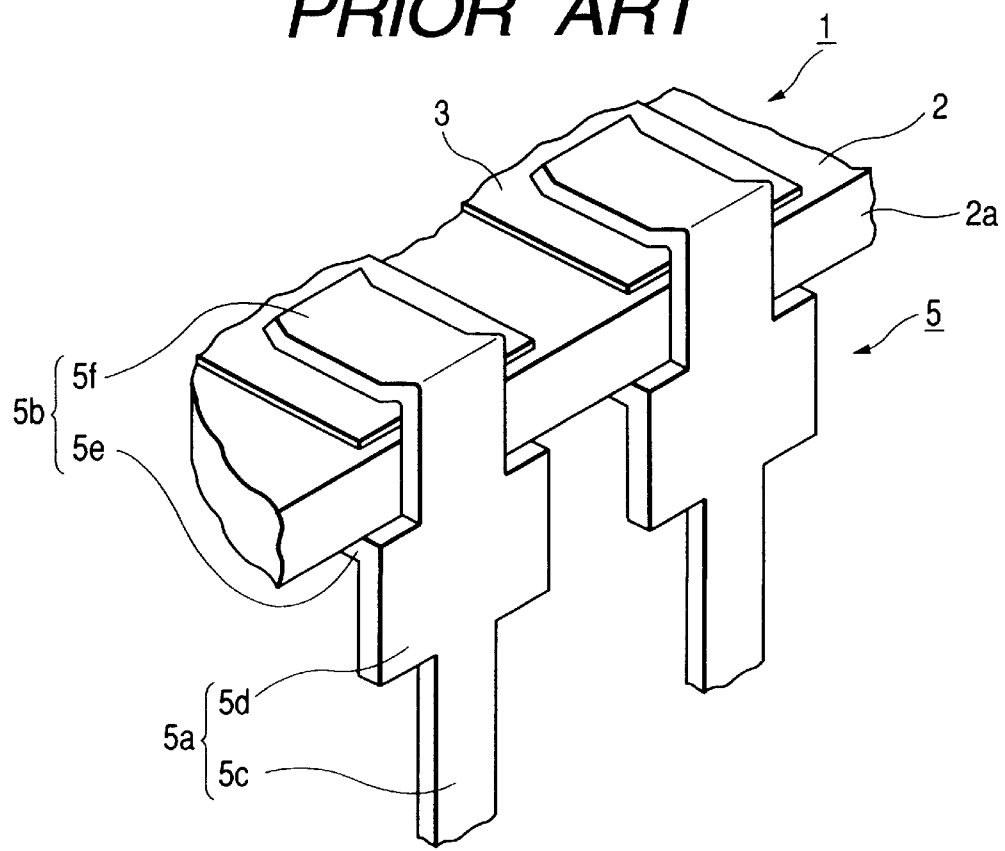
FIG. 4 is a partial perspective view thereof.

A terminal mounting structure for a printed circuit board according to an embodiment of the present invention will be described below with reference to the accompanying drawings, in which FIG. 1 is a sectional view of the terminal mounting structure and FIG. 2 is a partial perspective view thereof.

As shown in both figures, the terminal mounting structure of this embodiment comprises a printed circuit board 1 with a predetermined electronic circuit formed thereon and terminals 6 connected to the electronic circuit on the printed circuit board.

The printed circuit board 1, which is formed using a glass-filled epoxy resin for example, comprises a board 2 formed in the shape of a flat plate, wiring patterns 3 formed in predetermined shapes on both surface and back of the board 2 by etching a copper foil for example, and a plurality of electric components 4 such as an integrated circuit (LSI), a chip capacitor and a chip resistor, connected to the wiring patterns 3. Also near each of associated end faces 2a of the board 2 are formed wiring patterns 3 on both the surface and the back of the board. A predetermined electronic circuit is constituted by the electric components 4 and the wiring patterns 3.

In the vicinity of a wiring pattern 3 a slit 2b is formed in the board 2 in a direction perpendicular to each of the associated end faces 2a of the board.

The terminal 6 is formed by punching and bending an electrically conductive metallic plate and it comprises a U-shaped holding portion 6a, a lead-out terminal part 6b bent downward from the holding portion 6a, and a projecting part 6c projecting in the transverse direction from the holding portion 6a.

The U-shaped holding portion 6a comprises first and second clamp pieces 6d, 6e opposed to each other substantially in parallel, and a connection piece 6f for connection between both clamp pieces 6d and 6e. A corner between the first clamp piece 6d and the connection piece 6f is cut out, as indicated at 6g, and at a side end of the first clamp piece 6d positioned on the side opposite to the lead-out terminal part 6b there is formed a resilient part 6h of a general V shape parallel to the side end and having resilience. The connection piece 6f is formed with a plurality of semispherical protuberances 6i projecting outwards. The length of the second clamp piece 6e in an extending direction of the connection piece 6f is larger than the length of the first clamp piece 6d in the same direction, and the projecting part 6c extending in a direction orthogonal to the extending direction of the connection piece 6f is formed at one side of the second clamp piece 6e. The projecting part 6c and the second clamp piece 6e are flush with each other.

The terminal 6 is locked with the connection piece 6f of its U-shaped holding portion 6a inserted into the slit 2b formed in the board 2 of the printed circuit board 1. In this state, the resilient part 6h and projecting part 6c of the terminal 6 are in abutment with wiring patterns 3, and the protuberances 6i of the connection piece 6f of the terminal 6 are in pressure contact with an inner wall of the slit 2b.

The terminal 6 is disposed one or plural on the board 2 at a predetermined position or positions.

Now, a description will be given below of how to mount each terminal to the printed circuit board.

First, the electric components 4 are temporarily fixed to predetermined positions of the wiring patterns 3 formed on the board 2 and are thereafter fixed to the wiring patterns by soldering. Next, the longer second clamp piece 6e of the terminal 6 is brought into abutment against the underside of the printed circuit board 1. In this state, with the second clamp piece 6e as a reference, the connection piece 6f of the holding portion 6a of the terminal 6 is inserted into the slit 2b formed in the board 2. With this fitting motion of the connection piece, the V-shaped resilient part 6h of the first clamp piece 6d comes into abutment against the associated end face of the printed circuit board 1, then its V shape allows it to move upward into elastic contact with the upper surface of the printed circuit board 1 Thus, the first and second clamp pieces 6d, 6e of the terminal 6 clamp the printed circuit board 1.

The projecting part 6c projecting from the second clamp piece 6e lies on the underside of the printed circuit board 1 and functions as a guide during insertion of the connection piece 6f.

The resilient part 6h of the terminal 6 permits the first clamp piece 6d to be smoothly fitted on the upper surface of the printed circuit board 1.

The slit 2b functions as a positioning means when the terminal 6 is fitted on the board 2. When the terminal 6 has thus been located at a predetermined position on the board 2, its resilient part 6h and projecting part 6c are in abutment against wiring patterns 3 and the protuberances 6i of the connection piece 6f are in pressure contact with an inner wall of the slit 2b, so that the terminal 6 is temporarily fixed to the board 2. Next, the wiring patterns 3 and the resilient part 6h and projecting part 6c of the terminal 6 are fixed together by soldering. Now, the terminal mounting operation is completed.

Although in the above embodiment the wiring patterns 3 and the electric components 4 are disposed on both surface and back of the board 2, no limitation is made thereto. The wiring patterns 3 and electric components 4 may be disposed on only one side, or the electric components 4 may be disposed on one side and the wiring patterns 3 on the other side.

As set forth above, the terminal mounting structure according to the present invention comprises a printed circuit board having a wiring pattern and a slit and a terminal connected to the wiring pattern, the terminal comprising a U-shaped holding portion having first and second clamp pieces opposed to each other and also having a connection piece for connection between the first and second clamp pieces, and the first or the second clamp piece being connected to the wiring pattern on the printed circuit board. When mounting the terminal to the printed circuit board, the slit formed in the board guides the movement of the terminal and so there is attained such an effect that the terminal mounting work becomes easier.

In the terminal mounting structure according to the present invention, moreover, since one of the first and second clamp pieces of the terminal is provided with a resilient part for elastic contact with the printed circuit board, the terminal can be positively secured to the printed circuit board through the resilient part and hence positioning of the terminal can be done accurately.

Further, in the terminal mounting structure according to the present invention, since a protuberance for pressure contact with an inner wall of the board slit is formed on the connection piece of the terminal, the engagement of the connection piece with the slit is ensured, that is, the terminal can be locked more reliably to the printed circuit board.

Further, in the terminal mounting structure according to the present invention, since the length of the second clamp piece of the terminal in an extending direction of the connection piece is larger than the length of the first clamp piece in the same direction and a projecting part extending in a direction orthogonal to the extending direction of the connection piece is formed at one side of the second clamp piece, the projecting part guides the terminal when mounted to the printed circuit board, whereby the terminal mounting work can be done easily.

What is claimed is:

1. A terminal mounting structure for a printed circuit board comprising:

a printed circuit board having a wiring pattern formed on at least one side of the printed circuit board and also having a slit formed in an end face of the printed circuit board; and a terminal connected to said wiring pattern on the printed circuit board, said terminal having a U-shaped holding portion, said U-shaped holding portion being provided with first and second clamp pieces and a connection piece for connection between said first and second clamp pieces, and wherein said terminal is positioned with respect to said printed circuit board by inserting said connection piece into said slit formed in the printed circuit board, the printed circuit board is clamped by said first and second clamp pieces, and said first or said second clamp piece is connected to said wiring pattern formed on the printed circuit board.

2. A terminal mounting structure for a printed circuit board according to claim 1, wherein at least one of said first and second clamp pieces of said terminal is provided with a resilient part for elastic contact with said printed circuit board.

3. A terminal mounting structure for a printed circuit board according to claim 1, wherein said connection piece of said terminal is formed with a protuberance for pressure contact with an inner wall of said slit formed in the printed circuit board.

4. A terminal mounting structure for a printed circuit board according to claim 1, wherein the length of said second clamp piece in an extending direction of said connection piece is larger than the length of said first clamp piece in the same direction, and a projecting part extending in a direction orthogonal to the extending direction of the connection piece is formed at one side of the second clamp piece.

* * * * *